US006492803B2

(12) United States Patent
Bell et al.

(10) Patent No.: US 6,492,803 B2
(45) Date of Patent: Dec. 10, 2002

(54) APPARATUS AND METHOD FOR ENABLING AUTO-INSERTION OF PRODUCTION LEVEL DEVICES

(75) Inventors: James S. Bell, Austin, TX (US); Lonnie W. Smith, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 13 days.

(21) Appl. No.: 09/727,668

(22) Filed: Dec. 1, 2000

(65) Prior Publication Data

US 2002/0067156 A1 Jun. 6, 2002

(51) Int. Cl.$^7$ ................................................ G01R 31/02
(52) U.S. Cl. .................................................. 324/158.1
(58) Field of Search ................................. 361/801, 802, 361/771, 772; 324/158.1; 439/66, 67

(56) References Cited

U.S. PATENT DOCUMENTS

| | | | | |
|---|---|---|---|---|
| 3,932,016 A | * | 1/1976 | Ammenheuser | 339/17 |
| 4,357,575 A | | 11/1982 | Uren et al. | |
| 5,485,096 A | | 1/1996 | Aksu | |
| 5,506,751 A | * | 4/1996 | Chatel | 361/690 |
| 5,698,990 A | | 12/1997 | Aussant | |
| 5,726,865 A | * | 3/1998 | Webb et al. | 361/801 |
| 6,233,154 B1 | * | 5/2001 | Farnworth et al. | 361/752 |
| 6,191,474 B1 | * | 2/2002 | Kinsman et al. | 361/802 |

* cited by examiner

Primary Examiner—Michael Sherry
Assistant Examiner—Jimmy Nguyen
(74) Attorney, Agent, or Firm—Haynes and Boone, LLP

(57) ABSTRACT

An apparatus is provided for retaining a production level device for use with an automated testing device for testing personal computer components. The apparatus includes an extrusion having a first portion for receiving the production level device and a second portion for attaching the extrusion to the automated test device. The apparatus also includes a moldable fastener for precisely fastening the production-level device to the first portion.

12 Claims, 7 Drawing Sheets

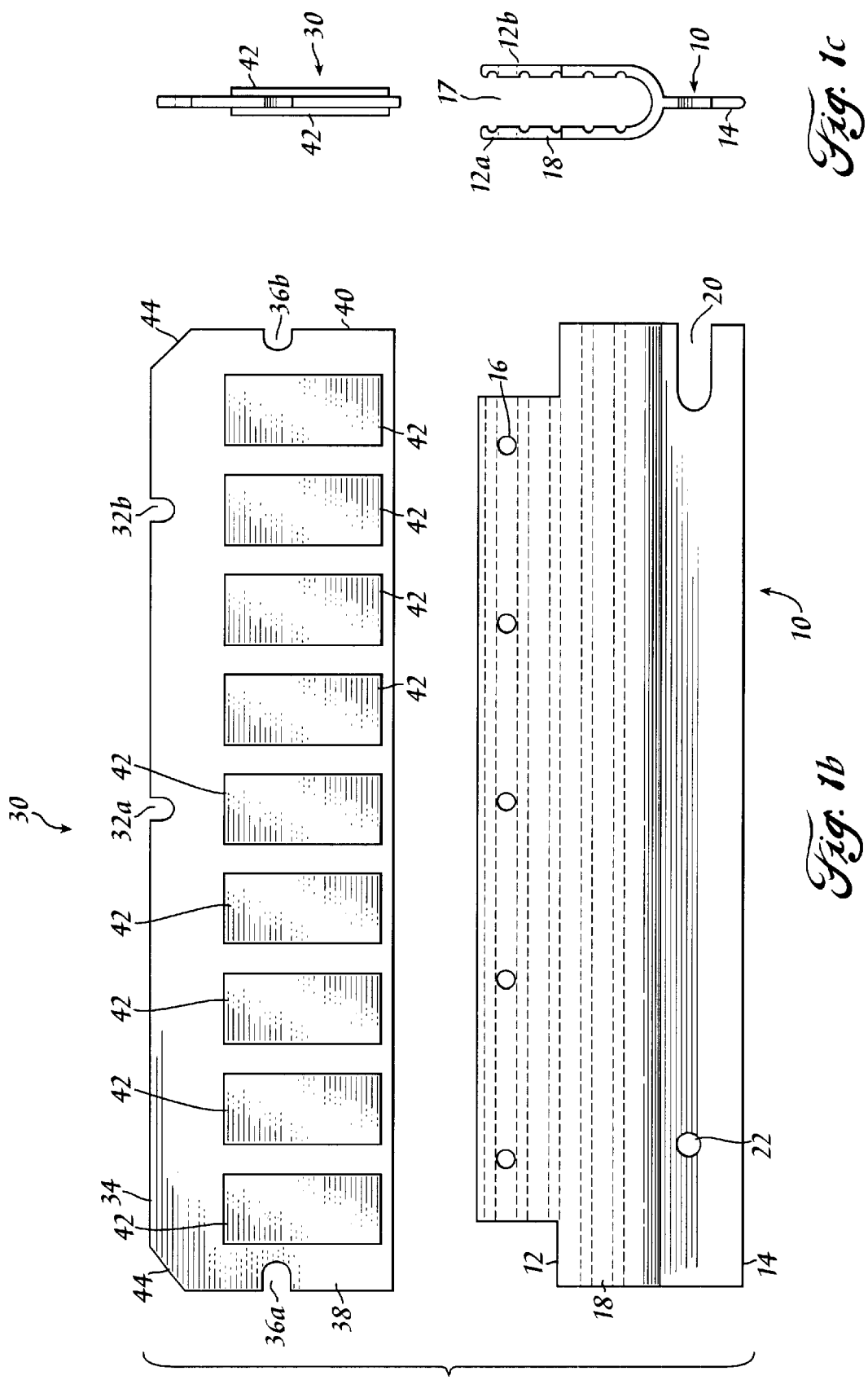

APPARATUS AND METHOD FOR ENABLING AUTO-INSERTION OF PRODUCTION LEVEL DEVICES

BACKGROUND

The disclosures herein relate generally to computer systems and, more particularly, to enabling auto-insertion of production level devices ("PLDs").

Computer systems and components require testing during manufacture and assembly to ensure proper operation. This testing requires that PLDs, such as audio cards, video cards, and memory modules, be inserted into appropriate connectors to test the functionality of the connectors. The wide variety of connectors available requires that many different sizes and shapes of PLDs be used during testing. The repetitive insertion and removal of a PLD stresses the PLD, which eventually causes breakage and/or failure of the PLD.

One method used for the actual insertion and removal process is to manually insert and remove the PLDs. However, the manual insertion of PLDs, such as dual in-line memory modules ("DIMMs"), by a test operator for the purpose of functionally testing motherboards has proven in the past to cause extensive damage to the motherboards and the PLDs, which results in increased cost to manufacturers. Automated testing was introduced to overcome some of the problems presented by the manual testing procedures, but the testing introduced other complications.

A major complication introduced with automated testing devices is that they require a means to access the tooling features of a PLD, which for purposes of example is a DIMM. Tooling features on a DIMM or other PLD are holes placed on the printed circuit board which are used during the manufacturing process for hold-down purposes, and to determine the degree of conformity of the position of a pattern relative to its intended position, or with that of any other conductor layer of the board. During automated testing, the tooling features are used by an automated test device to correctly insert the DIMM module into the appropriate connector of a computer unit under test ("UUT"). However, different PLDs generally have different tooling features and a large variety of PLDs may be used to test the various connectors of a UUT. Because of this variety, the testing procedures and equipment should account for all the variations in tooling features.

In order to align the DIMM during the insertion process, the automated test equipment generally uses special tooling holes which have been added to the DIMM and are matched against the available tooling features on the DIMM. These tooling holes are generally non-plated tooling holes which have a very tight tolerance. However, DIMMs typically have very little available space for adding the tooling holes and so additional material is generally needed on the DIMM to provide sufficient surface area.

Because of the lack of available space on which to place the tooling holes, it is often necessary to create custom PLDs to use during testing. This is an expensive solution which requires relatively long lead times to design, create, and incorporate into the testing process. Once developed, future versions of the custom device are generally necessary as the tooling features on the PLDs often change over time. Each iteration requires extensive redesign and related tooling costs.

To avoid these and other problems, it is desirable to have a device which is able to utilize "off the shelf" PLDs for automated testing, without expensive customization or excessive retooling. Such a device would provide the ability to securely retain a PLD, such as a standard DIMM, and could be used for multiple types of PLDs without extensive modification. Therefore, what is needed is a device that enables the auto-insertion of PLDs into a UUT using automated testing equipment.

SUMMARY

One embodiment, accordingly, provides for retaining a production level device for use with an automated testing device for testing personal computer components. To this end, an extrusion includes a first portion for receiving the production level device and a second portion for attaching the extrusion to the automated test device. The production level device is precisely retained in the first portion by a moldable fastener.

A principal advantage of this embodiment is that the production level device is held in the correct position which enables accurate auto-insertion to occur.

BRIEF DESCRIPTION OF THE DRAWINGS

FIG. 1b is a view taken along line 1b—1b of FIG. 1a.

FIG. 1c is a view taken along line 1c—1c of FIG. 1a.

FIG. 4a is one embodiment of a schematic view of an extrusion designed to hold a production level device, shown with an inserted production level device.

FIG. 4b is a view taken along line 4b—4b of FIG. 4a.

FIG. 5b is a view taken along line 5b—5b of FIG. 5a.

FIG. 5c is a view taken along line 5c—5c of FIG. 5a.

DETAILED DESCRIPTION

Figure 1A:
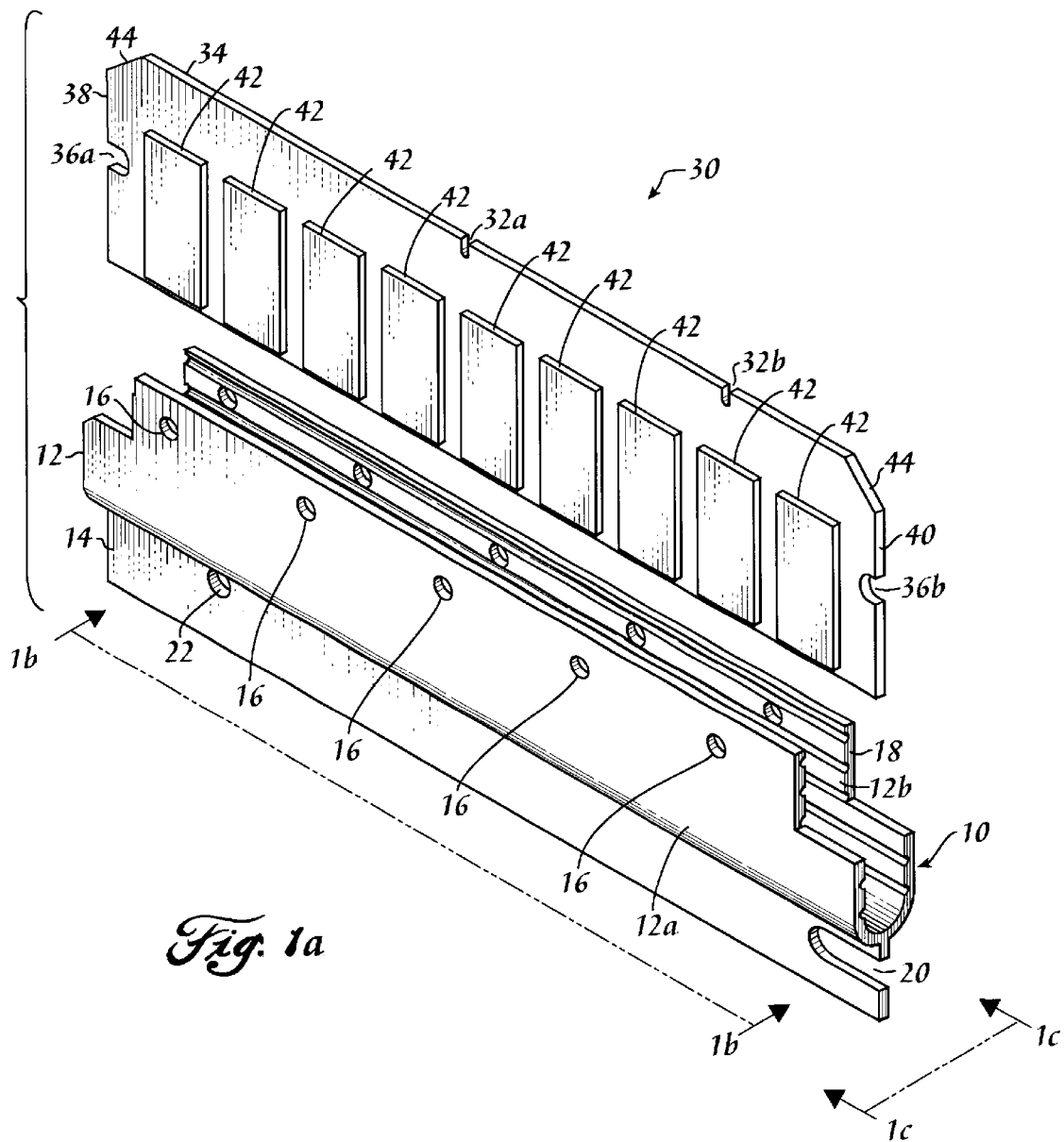
FIG. 1a is a view of an exemplary extrusion to hold a production level device, shown with an uninserted production level device.

Referring to FIGS. 1a, 1b, and 1c, in one embodiment, the reference numeral 10 indicates an extrusion capable of accepting a PLD. The extrusion 10, substantially Y-shaped in cross-section, may be viewed as comprising a curved, U-shaped portion 12 formed by two flanges 12a and 12b, and connected to a planar portion 14 as better illustrated in FIG. 1c. The two portions 12 and 14 are connected along their longitudinal axes to form the single Y-shaped extrusion 10.

The U-shaped portion 12 includes a plurality of holes 16 formed therein. The holes 16 extend substantially parallel along both flanges 12a and 12b of the U-shaped portion 12 and serve as tooling holes to match available tooling features as will be described. The precise location, number, shape, and dimensions of the holes 16 are dictated by the particular tooling features to be matched. The internal surfaces of the U-shaped portion 12 define a groove 17. The groove 17 contains multiple ribs 18 which run longitudinally down the length of the U-shaped portion 12 in a substantially parallel fashion as illustrated in FIGS. 1a, 1b, and 1c.

The planar portion 14 contains a slot 20 and a hole 22 formed therein. The slot 20 and the hole 22 serve as conventional positioning and fastening features to allow the extrusion 10 to be inserted into a clamping device, as will be described in reference to FIGS. 5a, 5b and 5c.

Also illustrated in FIGS. 1a, 1b and 1c, is a PLD 30, which for purposes of this example is a DIMM, although the PLD 30 may be any type of device, card, or circuit board capable of being inserted into a receptacle or connector in a computer system. The DIMM 30 contains multiple slots 32a and 32b along an edge 34 of the DIMM 30 and additional slots 36a and 36b, which are located on edges 38 and 40 of the DIMM 30, respectively. The slots 32a, 32b, 36a and 36b serve as tooling features on the DIMM 30. In addition, the DIMM 30 contains a number of memory chips 42, which serve as the foundation for the DIMM 30's random access memory capabilities. The memory chips 42 appear on both sides of the DIMM 30, as better illustrated by FIG. 1c. Also illustrated in FIGS. 1a and 1b are a pair of corners 44 of the DIMM.

Figure 2:
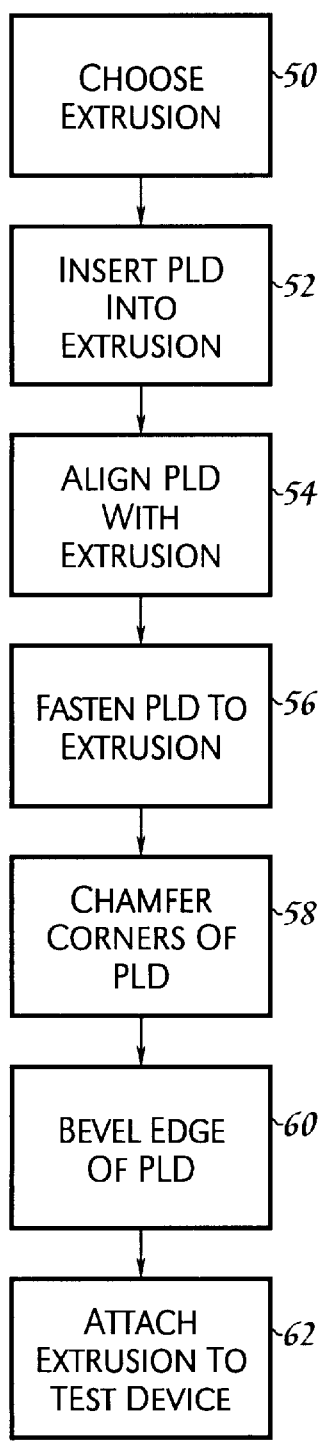
FIG. 2 is an exemplary method for utilizing a production level device for automated testing.

Referring now to FIG. 2, an exemplary method for utilizing a PLD for automated testing, such as the PLD 30 of FIGS. 1a, 1b and 1c, is shown. Continuing the above example, the PLD 30 is a DIMM. Beginning with step 50, an extrusion 10, such as the extrusion 10 of FIGS. 1a, 1b and 1c, is chosen to match the tooling features of the DIMM 30, such as the tooling features 32a, 32b, 36a and 36b of FIGS. 1a, 1b and 1c.

Once the appropriate extrusion 10 has been selected in step 50, the method moves to step 52. In step 52, the DIMM 30 is inserted into the extrusion 10 using an assembly device 70, such as the assembly device 70 of FIG. 3.

Figure 3:
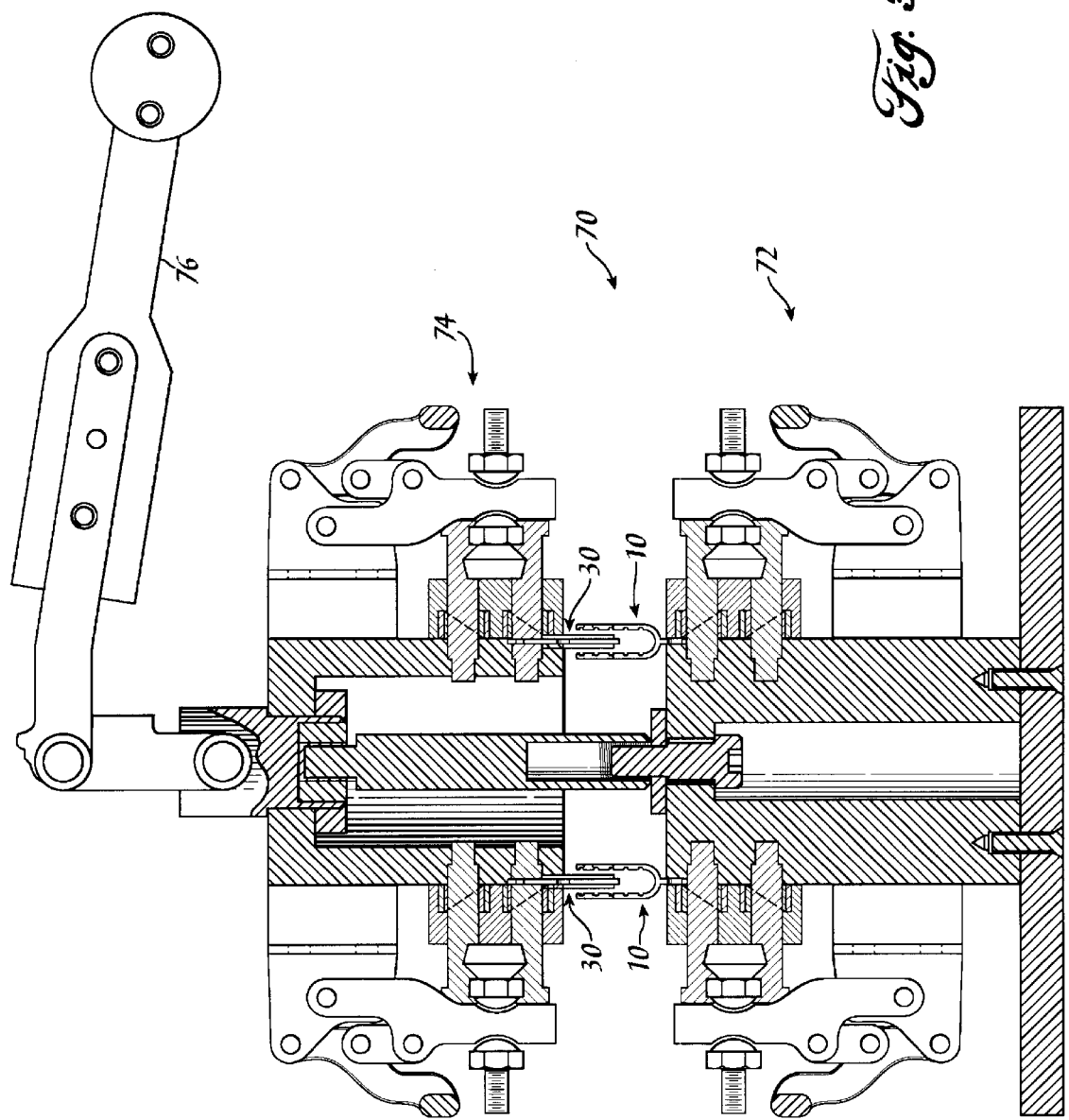
FIG. 3 is a schematic view of one embodiment of a device for inserting production level devices into extrusions.

Referring now to FIG. 3, the device 70 comprises two fastener blocks 72 and 74, which may hold multiple extrusions 10 and DIMMs 30, respectively. The exact method of holding the extrusions 10 and the DIMMs 30 may vary, but preferably allows the position of the extrusions 10 and the DIMMs 30 to be adjusted while retaining them firmly.

Multiple extrusions 10 are inserted into the fastening block 72. Multiple DIMMs 30 are likewise inserted into the fastening block 74 and positioned using tooling features on each DIMM 30 so as to be exactly opposite their respective extrusions 10. After aligning the extrusions 10 and the DIMMs 30 appropriately, a handle 76 is used to manually reposition the fastening blocks 72 and 74 so that each DIMM 30 is inserted into each corresponding extrusion 10. The device 70 allows the DIMMs 30 to be precisely aligned and inserted into the extrusions 10, as required by step 54 of FIG. 2.

Returning now to FIG. 2, after the DIMM 30 is placed in the extrusion 10 and properly aligned as described above in steps 52 and 54, the method moves to step 56. In step 56, the DIMM 30 is precisely positioned and fixed in place between the flanges of the U-shaped portion 12 using a moldable fastener such as an epoxy, e.g. available from the 3M Company of St. Paul, Minn. The epoxy is preferably both non-sagging and non-conductive. The epoxy is applied to the surfaces between the DIMM 30 and the flanges of the U-shaped portion 12. A sufficient quantity of epoxy is used such that the space between the DIMM 30 and flanges of the U-shaped portion 12 is completely filled. The epoxy provides a method of retaining the DIMM 30 precisely in the required location regardless of variations in the dimensions of different DIMMs. This is because the soft pliable epoxy molds itself around the DIMM 30 and then takes a set to hold the DIMM 30 in place. The extrusion 10, in combination with the epoxy, holds the DIMM 30 in such a way that bowing of the DIMM may not occur, which further decreases stress on the DIMM 30 during insertion in a connector of a UUT.

Figures 4A, 4B:
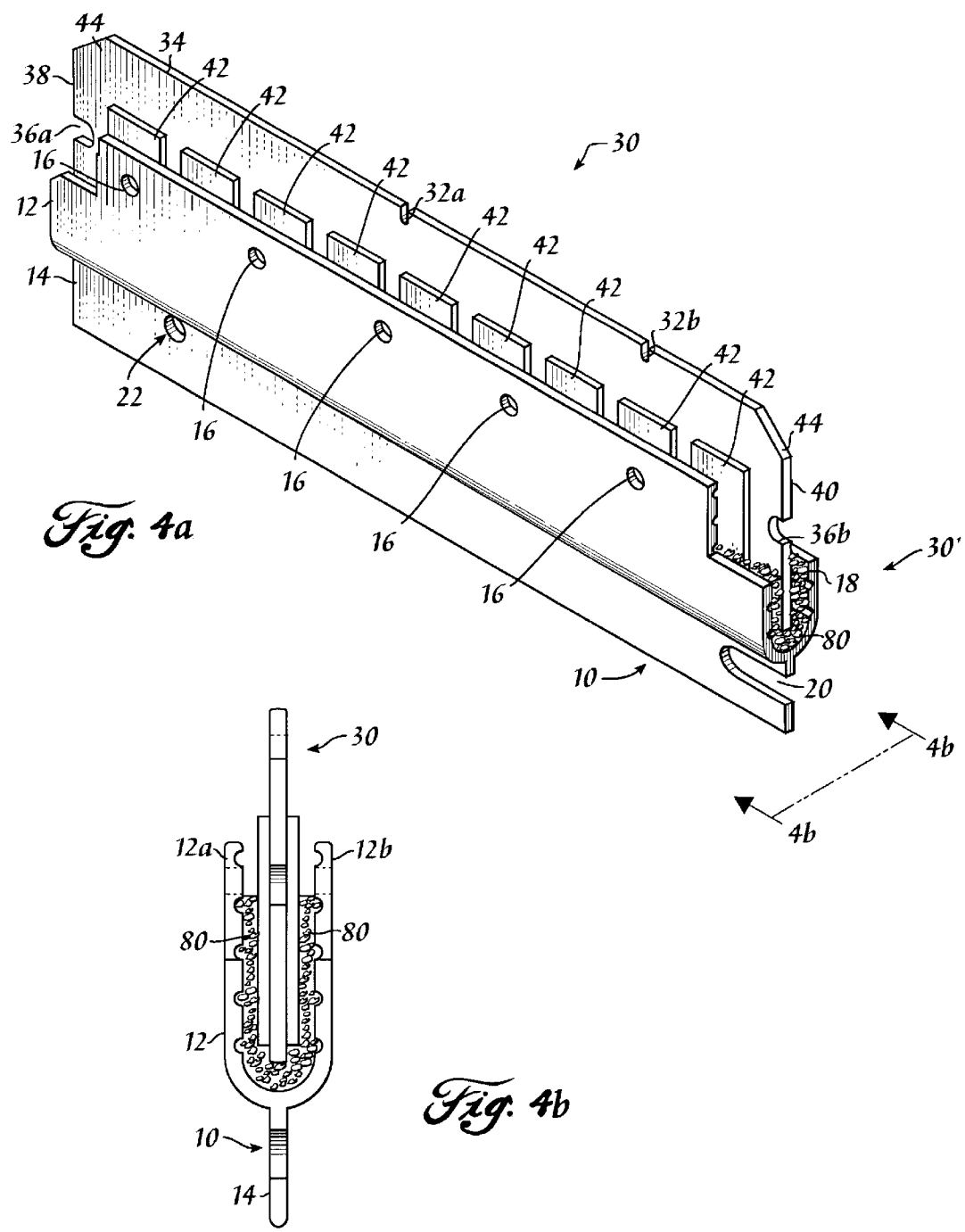

Referring now to FIGS. 4a and 4b, the extrusion 10 and DIMM 30 of FIGS. 1a, 1b and 1c, are shown with DIMM 30 inserted between the flanges of the U-shaped portion 12 of the extrusion 10 as described above. The DIMM 30 is retained in the extrusion 10 by an epoxy 80, such as the epoxy described above, and the combination of the extrusion 10 and the DIMM 30 comprises a test unit 30'.

Returning again to FIG. 2, the method continues to step 58. After the epoxy 80 has set and the DIMM 30 is firmly retained between the flanges 12a and 12b of the U-shaped portion 12 to form the test unit 30', the edge 34 and the corners 44 of the DIMM 30, as illustrated in FIGS. 1a and 1b, are altered to reduce wear on the DIMM 30 and to make testing easier. To accomplish this, the test unit 30' is mounted on a fixture, which is in turn attached to a sanding device (not shown), such as a commercial belt sander. The sander is used to chamfer the corners 44 from the DIMM 30. This prevents the DIMM 30, when inserted in a connector in a UUT, from engaging the connector's socket locking latches and allows the DIMM 30 to be easily removed from the connector.

In step 60, the sander is used to bevel both sides of the edge 34 of the DIMM 30 which is to be inserted into the connector. This beveling is accomplished by sanding away from the edge, which avoids slivers from the metal connector "fingers" of the DIMM 30. The now beveled edge 34 extends the insertion life of the DIMM 30 and also helps to avoid connector breakage.

Once the DIMM 30 has been chamfered and beveled, the method of FIG. 2 proceeds to a final step 62, where the test unit 30' is ready to be used in testing. To use the test unit 30' for testing, the test unit 30' is inserted into a clamping apparatus 90 such as the clamping device described in U.S. patent application Ser. No. 09/487,132, filed on Jan. 19, 2000, and also assigned to Dell USA, L.P., entitled "PC CARD CLAMPING DEVICE FOR AUTOMATED TEST FIXTURE" and hereby incorporated by reference as if reproduced in its entirety, and illustrated in FIGS. 5a, 5b and 5c.

Figure 5A:
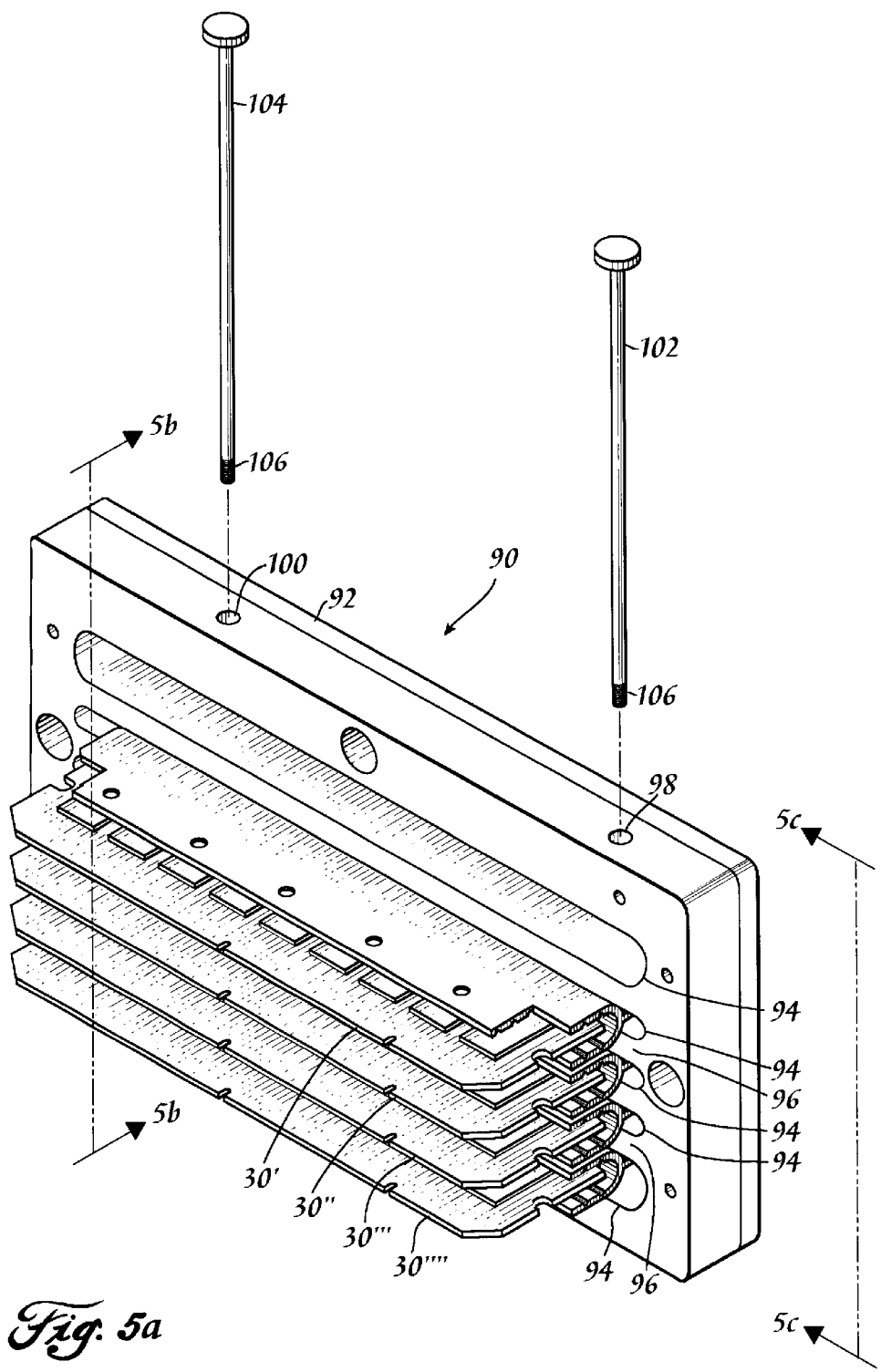
FIG. 5a is a perspective view of an exemplary clamping apparatus designed to hold multiple extrusions.
Figure 5B:
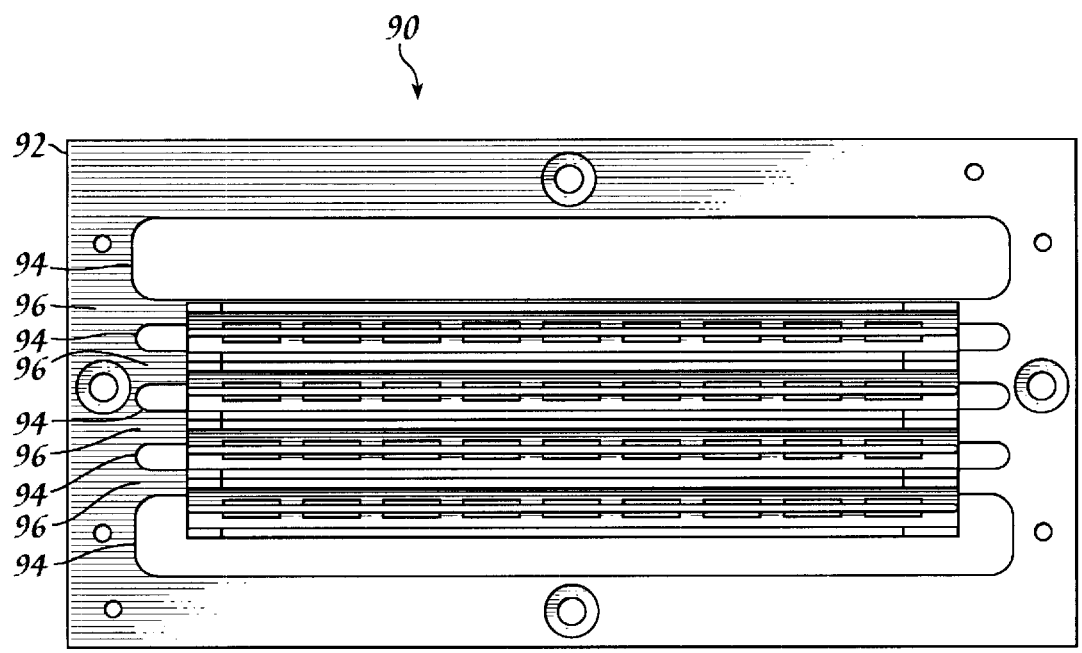
Figure 5C:
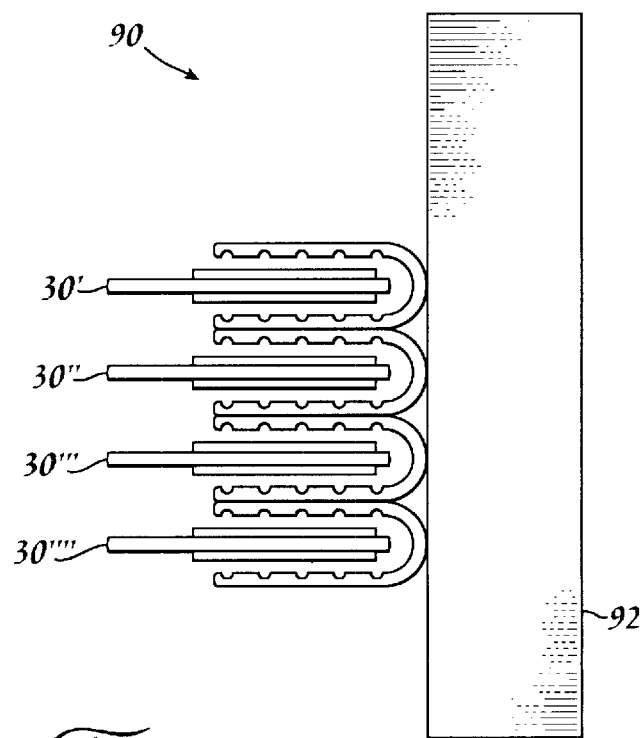

Referring now to FIGS. 5a, 5b and 5c, the clamping apparatus 90 includes a base member 92 having a plurality of slots 94 formed therein. The slots are divided by ribs 96. Two holes 98 and 100 allow access for two fasteners 102 and 104, respectively. The fasteners 102 and 104 are suitable for insertion into the holes 98 and 100. The fasteners include threaded ends 106, which are inserted into the holes 98 and 100 and engage threaded receivers therein.

To insert the test unit 30' into the base member 92, the fastener 104 must be removed. Once removed, the slot 20 of the planar portion 14, as illustrated in FIGS. 1a, 1b and 1c, is inserted into one of the slots 94 and engages the fastener 102 present in the hole 98. The end of the planar portion 14 containing the hole 22 is then rotatably inserted into the same slot 94. The base 90 may receive up to four test units 30', 30", 30'" and 30"" in its four slots 94.

Once the desired number of test units 30'–30"" have been inserted into the slots 94, the fastener 104 is inserted into the hole 100 and engages the holes 22 of the planar portions 14. Both fasteners 102 and 104 are then tightened in a conventional manner so that their respective threads 106 engage the receiving threads of the holes 98 and 100. Once the test units 30'–30"" have been restrained by the fasteners 102 and 104, the clamping apparatus 90 may be attached to an automated test device (not shown) and utilized in an automated test procedure as desired.

In an alternative embodiment, the corners of the PLD 30 are sanded after the extrusion 10 is inserted into the clamping apparatus 90 and before the clamping apparatus 90 is attached to a test fixture.

In another alternative embodiment, the PLD 30 is retained in the extrusion 10 by means of one or more clips or pins.

In yet another alternative embodiment, the extrusion 10 is formed comprising multiple U-shaped portions 12, which allows multiple PLDs 30 to be retained by a single extrusion 10

Although illustrative embodiments have been shown and described, a wide range of modification change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for retaining a production level device for use with an automated testing device for testing personal computer components, the apparatus comprising:
   - a y-shaped extrusion;
   - a first portion of the extrusion being U-shaped in cross-section for receiving the production level device, the first portion including tooling holes formed therein;
   - a plurality of opposed ribs formed in the first portion;
   - a second portion of the extrusion extending from the first portion and being attached to the automated test device; and
   - a moldable fastener precisely positioning and retaining the production level device in the first portion.

2. The apparatus of claim 1 wherein the fastening means is an epoxy.

3. The apparatus of claim 1 wherein the production level device has tooling features, whereby the production level device is aligned relative to the extrusion by matching the tooling holes of the extrusion with the tooling features on the production-level device.

4. The apparatus of claim 1 wherein the tooling holes in the extrusion are substantially parallel.

5. The apparatus of claim 1 wherein the U-shaped portion includes internal surfaces.

6. The apparatus of claim 5 wherein the internal surfaces of the U-shaped portion define a groove.

7. The apparatus of claim 6 wherein the groove in the U-shaped portion of the extrusion further comprises the plurality of ribs running longitudinally down the length of the extrusion.

8. The apparatus of claim 7 wherein the plurality of ribs are substantially parallel.

9. The apparatus of claim 1 wherein the second portion of the extrusion includes a plurality of openings formed therein.

10. The apparatus of claim 9 wherein the openings in the second portion of the extrusion include a slot and a hole.

11. The apparatus of claim 9 wherein the automated test device has fastening members, whereby the extrusion is attached to the automated test device by aligning the openings with the fastening members.

12. Apparatus for precisely locating a device comprising:
    - a y-shaped extrusion;
    - a first portion of the extrusion being U-shaped in cross-section for receiving a production level device, first portion including tooling holes formed therein;
    - a plurality of opposed ribs formed in the first portion;
    - a planar second portion of the extrusion extending from the first portion;
    - a moldable fastener retained in the first portion;
    - a first fastening block holding the second portion;
    - a second fastening block holding the production level device; and
    - a handle connected to position the first and second fastening blocks to insert the production level device into the moldable fastener in the first portion.

* * * * *